United States Patent [19]
Onodera et al.

[11] Patent Number: 5,576,111
[45] Date of Patent: Nov. 19, 1996

[54] MAGNETIC RECORDING MEDIUM

[75] Inventors: Katsumi Onodera; Koji Ito; Manabu Koike; Tamotsu Hatakoshi; Kazuyoshi Tomita; Kazuo Nimura, all of Kawasaki, Japan

[73] Assignee: Fuji Electric Co., Ltd., Kawasaki, Japan

[21] Appl. No.: 273,161

[22] Filed: Jul. 22, 1994

Related U.S. Application Data

[60] Continuation of Ser. No. 966,337, Oct. 26, 1992, abandoned, which is a division of Ser. No. 759,573, Sep. 16, 1991, Pat. No. 5,232,750.

[30] Foreign Application Priority Data

Sep. 17, 1990 [JP] Japan ................................ 2-246558
Feb. 18, 1991 [JP] Japan ................................ 3-022458

[51] Int. Cl.$^6$ ............................................ B32B 3/00
[52] U.S. Cl. ....................... 428/612; 428/626; 428/634; 428/667; 428/652
[58] Field of Search ........................... 428/621, 622, 428/623, 634, 635, 626, 611, 612, 667, 928, 652, 668, 624; 360/135

[56] References Cited

U.S. PATENT DOCUMENTS

| | | | |
|---|---|---|---|
| 3,297,418 | 7/1967 | Firestone | 428/680 |
| 4,698,251 | 10/1987 | Fukuda et al. | 428/64 |
| 4,816,351 | 3/1989 | Takagi et al. | 428/694 |
| 5,061,537 | 10/1991 | Kobayashi et al. | 428/66 |
| 5,080,948 | 1/1992 | Morita et al. | 428/64 |
| 5,082,709 | 1/1992 | Suzuki et al. | 428/928 |
| 5,094,897 | 3/1992 | Morita et al. | 428/64 |
| 5,114,778 | 5/1992 | Yanai et al. | 428/141 |

FOREIGN PATENT DOCUMENTS

| | | |
|---|---|---|
| 0317681 | 4/1991 | Japan. |
| 3176814 | 7/1991 | Japan. |

Primary Examiner—Robert A. Dawson
Assistant Examiner—Linda L. Gray
Attorney, Agent, or Firm—Spencer & Frank

[57] ABSTRACT

A surface of a non-magnetic base plate is first coarsened to a required surface roughness and an ultrasonic vibration is then applied to the surface of the non-magnetic base plate while the nonmagnetic base plate is immersed in a liquid. Thereafter, a magnetic recording layer and a protective layer are successively formed on the surface of the non-magnetic base plate thereby to produce a magnetic recording medium. It is preferable that the frequency of a ultrasonic is within a range from 200 kHz to 1600 kHz. Surface fractional properties of the magnetic recording medium can adequately be controlled without variation of floatation height of a magnetic head during its running by varying an ultrasonic oscillation output and an ultrasonic processing time.

15 Claims, 4 Drawing Sheets

MAGNETIC RECORDING MEDIUM

This application is a continuation of application Ser. No. 07/966,337, filed Oct. 26, 1992, now abandoned which is a divisional application of Ser. No. 07/759,573 filed Sep. 16, 1991 now U.S. Pat. No. 5,232,750.

BACKGROUND OF THE INVENTION

1. Field of the Invention

The present invention relates to a method for fabricating a magnetic recording medium, and more particularly, relates to a method for fabricating a magnetic recording medium to be installed in a fixed magnetic disc unit or the like employable as an external memory unit for an information processing apparatus such as a computer or the like.

2. Description of the Prior Art

In general, a magnetic recording medium is fabricated in such a manner that a magnetic thin film serving as a magnetic recording layer is first formed on a surface of a non-magnetic base plate and a hard protective film is then deposited on the magnetic thin film. A non-magnetic base plate which has been obtained by finishing a disc-shaped plate composed of an aluminum alloy, a reinforced glass, a plastic material, an amorphous carbon or the like to assume a predetermined degree of parallel, flatness and surface roughness may be employed. Alternatively, a non-magnetic base plate which has been obtained by forming a surface layer on the surface thereof by performing alumilite processing or Ni—P alloy electroless plating processing as desired and then finishing the surface layer to assume a required surface roughness is used. In addition, an underlayer for enhancing the magnetic properties of the magnetic thin film, e.g., a chromium layer is additionally formed on the non-magnetic base plate as desired. A Co—Ni—P alloy layer serving as a magnetic recording layer is formed on the nonmagnetic base plate by employing a electroless plating process. Alternatively, a magnetic metallic film such as a cobalt alloy film or the like or a magnetic oxide film such as a $\gamma$-$Fe_2O_3$ film or the like is formed on the non-magnetic base plate by employing a sputtering process and so on. A thin film composed of graphite, $SiO_2$ or the like is formed on the magnetic thin film as a hard protective film of the aforementioned type by employing a sputtering process, a spin coating process or the like. Further, a liquid lubricant for improving lubricating and wear resisting properties of the magnetic recording medium is coated on the hard protective film as desired.

With respect to the fixed magnetic disc unit, an information reading/writing operation is performed for the aforementioned magnetic recording medium with the aid of a magnetic head. Usually, a contact start stop process (hereinafter referred to as a CSS process) is employed for performing the information reading/writing operation. To practice the CSS process, the magnetic head is caused to run while it is floated by a small height (about 0.1 μm to 0.3 μm) by a function induced by an air stream appearing between the magnetic head and the magnetic recording medium when the magnetic disc is driven for performing the information reading/writing operation. On the contrary, when the disc is stationary, the magnetic head is brought in contact with the surface of the magnetic recording medium. When driving of the disc is started, the magnetic head slidably moves along the surface of the magnetic recording medium which has started its rotation. Similarly, when driving of the disc is stopped, the magnetic head slidably moves along the surface of the magnetic recording medium which has stopped its rotation. For this reason, to assure that an information reading/writing operation is smoothly performed, it is required that no abnormal projection is present on the surface of the magnetic recording medium so as not to obstruct stable running of the magnetic head in a floated state, and moreover, the surface of the magnetic recording medium is adequately finely coarsened so as to maintain a low coefficient of friction without any occurrence of a malfunction such as hot seizure of the magnetic head during slidable movement of the same.

To meet the foregoing requirement, surface irregularities are usually formed on the surface of the non-magnetic base plate by employing a texture working process or the like after the surface of the non-magnetic base plate is worked by performing a grinding operation or the like so as to assume a very fine surface roughness approximate to a mirror surface. To this end, a magnetic recording medium is produced by using a non-magnetic base plate which has been worked to assume such a surface roughness as represented by an index $\Delta Cv$ (10%–1%) of which value is about 0.01 μm to 0.02 μm or more wherein the index $\Delta Cv$ (10%–1%) is derived from subtraction of a cutting depth corresponding to one percent bearing length ratio from a cutting length corresponding to ten percent bearing length ratio on the curve of a profile bearing length ratio as specified in accordance with ISO (International Standard) 4287/1—1984. When an underlayer, a magnetic layer and a protective layer are successively formed on the surface of the base plate having fine projection as mentioned above by employing a sputtering process under suitable sputtering conditions, fine projections corresponding to fine projections on the surface of the non-magnetic base plate or increased surface irregularities are formed on the surface of the magnetic recording medium. As a result, good sliding of the magnetic head and stable running of the magnetic head in a floated state can practically be realized.

A number of fine projections have been hitherto formed on the surface of the magnetic recording medium in the above-described manner because of a necessity for reducing the coefficient of friction of the surface of the magnetic recording medium.

In recent years, as the amount of information to be processed increases, a fixed magnetic disc unit has been positively designed and constructed in such a manner as to have a larger capacity. However, when a magnetic head is caused to run in a very low floated state (with a floatation of, e.g., 0.1 μm or less) so as to allow the recording of information on a magnetic recording medium with a higher recording density or reading information recorded with a higher recording density, in view of the aforementioned current tendency, there arises a problem in that it is difficult to run the magnetic head in a stably floated state against a magnetic recording medium which is produced by employing a conventional method wherein a number of fine projections are previously formed on the surface of a base plate. To practically realize stable running of the magnetic head in a very low floated state, it is necessary that the height of each projection be reduced much more than that obtainable with the conventional method. However, a difficulty is that the fine projections mentioned above are formed while their height is made uniform in order to prevent formation of projections each having an abnormal height which may allow head crush to take place. In addition, since the base plate is made of a hard material, it is likewise difficult that head parts of the projections each having an abnormal height are cut off at a subsequent step so as to make their height uniform.

Additionally, a proposal has been made with respect to a method of uniformly forming a number of fine projections each having a predetermined height on the surface of a magnetic recording medium wherein the method is practiced by way of steps of previously forming the fine projections each having a low height on a surface of a base plate, locally abnormally growing a film while a hydrocarbon base organic material distributed on the surface of the base plate is used as a core, enlarging the height of the projections formed on the surface of a magnetic recording medium, and thereafter, to make uniform the height of each projection by employing, e.g., a tape burnishing process. With respect to the method as mentioned above, since head parts of the projections are made of a carbon that is a comparatively soft material, this makes it possible to employ a tape burnishing process. However, in view of the current tendency of responding to the requirement for the higher recording density, a material having a high coercive force and with which a low noise is realized is required as a material the magnetic layer of the magnetic recording medium. As a result, the Co—Ni—Cr based alloy which has been mainly used at present is being shifted to a Co—Cr—Ta based alloy or a Co—Cr—Pt based alloy. An especially significant feature of the magnetic recording medium including a magnetic layer made of the foregoing material is that it exhibits low noise, and this is attributable to the fact that crystal grains are increasingly isolated due to segregation of chromium in the magnetic layer. As a result, there appears the drawback that it is difficult to improve a squareness of the magnetic hysteresis loop. However, to practically improve the squareness, it is necessary when the magnetic film is sputter grown on a base plate that the temperature of the base plate is elevated or a bias voltage is applied to the base plate. Conclusively, it is difficult to practically employ a method of forming a number of required fine projections on the surface of a magnetic recording medium by maintaining the temperature of a base plate at a low level during the film forming process as mentioned above.

SUMMARY OF THE INVENTION

The present invention has been made in consideration of the aforementioned background.

An object of the present invention is to provide a method for fabricating a magnetic recording medium having proper surface friction properties.

Another object of the present invention is to provide a method for fabricating a magnetic recording medium against which stable running of a magnetic head in a very low floated state can be practically realized.

A further object of the present invention is to provide a method of processing a non-magnetic base plate for the purpose of practically realizing a magnetic recording medium of the foregoing type.

In the first aspect of the present invention, a method for fabricating a magnetic recording medium comprises the steps of:

grinding at least one surface of a non-magnetic base plate;

immersing in a liquid the non-magnetic base plate which has been ground and applying an ultrasonic vibration to the at least one surface of the non-magnetic base plate; and successively forming a magnetic recording layer and a protective layer on the at least one surface of the non-magnetic base plate which has been subjected to ultrasonic processing.

Here, the method may further comprise a step of forming a chromium film on the at least one surface of the non-magnetic base plate prior to formation of the magnetic recording layer.

The frequency of the vibration may be within a range from 200 kHz to 1600 kHz.

The surface roughness of the magnetic recording medium may be such that a center-line mean roughness Ra as measured in the radial direction of the base plate is within the range from 0.0025 μm t 0.0045 μm, an index ΔCv (10%–1%) derived from subtraction of a cutting depth corresponding to one percent bearing length ratio on the curve of a profile bearing length ratio from a cutting depth corresponding to ten percent bearing length ratio on the same is within a range from 0.006 μm to 0.01 μm and a count number Pc2 (0.01 μm) of projections of which height as measured from the center of a surface roughness curve extending in the circumferential direction of the base plate being not less than 0.01 μm is within a range from 5 to 30 per 2.5 mm in the circumferential direction of the same.

The non-magnetic base plate may be an aluminum alloy plate on which a non-magnetic Ni—P alloy layer is formed.

The liquid may be a pure water.

In the second aspect of the present invention, a method for fabricating a magnetic recording medium comprises the steps of:

grinding at least one surface of a non-magnetic Ni—P alloy layer deposited on a non-magnetic base plate made of an aluminum alloy to make such a surface roughness that a center-line mean roughness Ra is substantially 0.004 μm, a maximum height Rmax is substantially 0.04 μm and an index ΔCv (10%–1%) derived from subtraction of a cutting depth corresponding to one percent bearing length ratio on the curve of a profile bearing length ratio from a cutting depth corresponding to ten percent bearing length ratio on the same is substantially 0.008 μm;

immersing in a liquid the non-magnetic base plate which has been ground and applying an ultrasonic vibration oscillated by an ultrasonic oscillator under conditions of a frequency of 750 kHz±100 kHz and an oscillation output of not less than 110 W to a surface of the non-magnetic Ni—P alloy layer; and forming a magnetic recording layer on the non-magnetic Ni—P alloy layer which has been subjected to ultrasonic processing.

In the third aspect of the present invention, a method for processing a non-magnetic base plate for forming a magnetic recording medium thereon, comprises the step of:

immersing the non-magnetic base plate into a liquid and applying an ultrasonic vibration on surfaces of the non-magnetic base plate prior to forming a magnetic recording layer on the non-magnetic base plate.

The above and other objects, effects, features and advantages of the present invention will become more apparent from the following description of embodiments thereof taken in conjunction with the accompanying drawings.

BRIEF DESCRIPTION OF THE DRAWINGS

The present invention is illustrated in the following drawings in which.

DETAILED DESCRIPTION OF PREFERRED EMBODIMENTS

Now, the present invention will be described in detail hereinafter with reference to the accompanying drawings which illustrate preferred embodiments of the present invention.

First, a number of disc-shaped aluminum alloy plates each having a diameter of five inches were prepared and a Ni—P alloy layer (containing a phosphor of 10% by weight) was then formed on the surface of each of the aluminum alloy plates by employing a electroless plating process to provide a non-magnetic base plate. After the surface of the non-magnetic base plate was ground to exhibit a mirror surface, the base plate was subjected to texture processing with the aid of an abrasive tape to produce a non-magnetic base plate having a surface roughness of which index ΔCv (10%–1%) derived from subtraction of a cutting depth corresponding to one percent bearing length ratio on the curve of a profile bearing length ratio from a cutting depth corresponding to ten percents bearing length ratio on the same differed from product to product. The thus produced base plates were washed using a surfactant or with pure water to remove an abrasive material or the like therefrom. Thereafter, they were divided into two groups.

Figure 1:
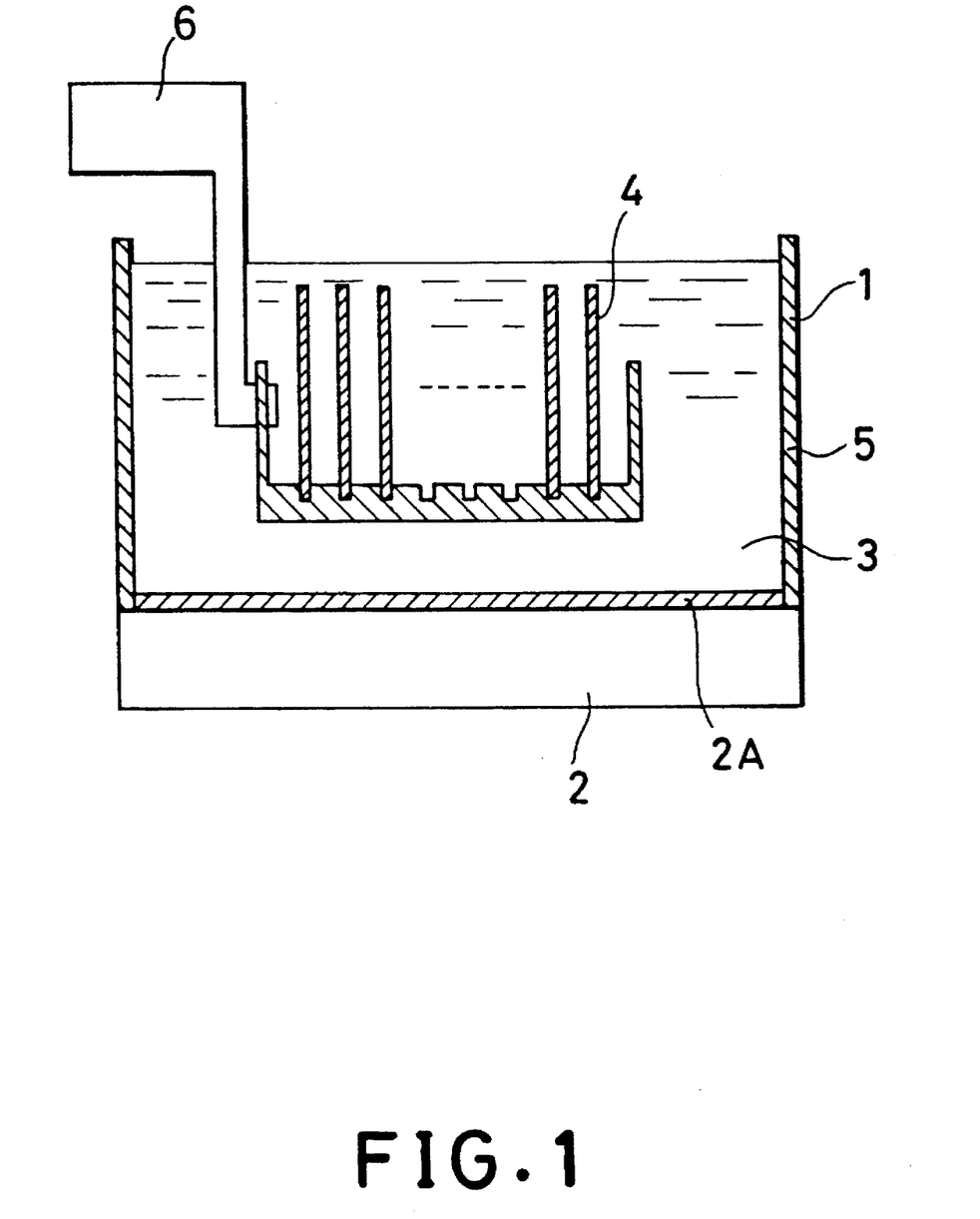
FIG. 1 is a schematic sectional view showing apparatus for applying an ultrasonic vibration on the surface of the non-magnetic base plate.

The base plates belonging to a first group were immersed in a pure water, and an ultrasonic vibration was applied to the surface of each of the base plates. A Finesonic Oscillator Model Pt-08M manufactured by Prettec Co., Ltd. was used as an ultrasonic oscillator. FIG. 1 is a schematic sectional view showing an apparatus for applying an ultrasonic vibration on the surfaces of the non-magnetic base plate. An ultrasonic oscillator 2 having a vibrator 2A is connected at the bottom of a bath 1. The ultrasonic vibration of the vibrator 2A is transmitted into water 3 contained in the bath 1. A plurality of the non-magnetic base plates 4 are fixed to a jig 5, which is supported by a support member 6, and immersed in the water 3. Thus by operating the ultrasonic oscillator 2, the surfaces of the non-magnetic base plates can be subjected to the ultrasonic vibration via water 3. Each base plate was subjected to ultrasonic processing for two minutes under operating conditions of a frequency of 750 kHz±100 kHz and an oscillation output of 116 W. After the base plate which had been subjected to ultrasonic processing in the above-described manner was dried, a non-magnetic chromium underlayer having a thickness of about 800 Å, a magnetic cobalt alloy (86% Co—12% Cr—2% Ta) recording layer having a thickness of about 500 Å and an amorphous carbon layer having a thickness of about 250 Å were successively deposited on the surface of the base plate by employing a sputtering process. Finally, the base plate was coated with a fluororesin lubricant to form a lubricant layer having a thickness of about 18 Å, whereby a magnetic recording medium was fabricated.

On the other hand, the base plates belonging to a second group were not subjected to ultrasonic processing but a chromium substrate layer, a cobalt alloy layer and an amorphous carbon layer were successively deposited on the surface of each of the base plates in the same manner as those belonging to the first group by likewise employing a sputtering process. Finally, each base plate was coated with a fluororesin lubricant thereby fabricating a magnetic recording medium.

Each of the magnetic recording mediums which had been produced in the above-described manner was placed on a magnetic disc unit, and a ferrite head was displaced to the position opposite to the magnetic recording medium at a radius of 35 mm so that the coefficient of kinetic friction and the floatation height of the magnetic head during its stable running were measured with respect to each magnetic recording medium. The rate of rotation of each magnetic recording medium was set to 100 r.p.m.

Figure 2:
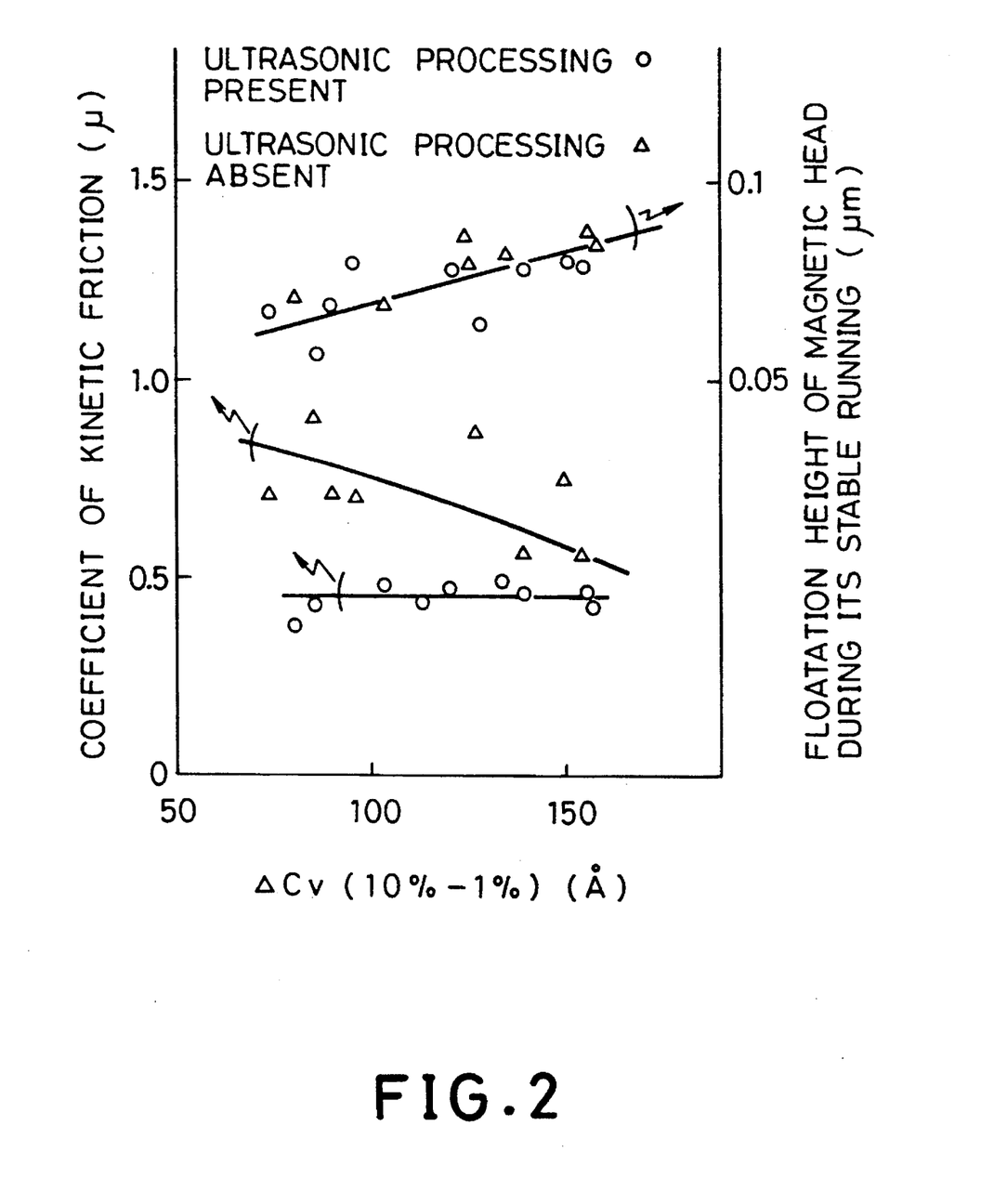
FIG. 2 is a diagram illustrating the dependency of the coefficient of kinetic friction of a magnetic recording medium and the floatation height of a magnetic head of its stable running on the surface roughness index ΔCv (10%–1%) of a base plate.

FIG. 2 is a diagram illustrating dependency of the coefficient of kinetic friction of the magnetic recording medium and a floatation height of a magnetic head during its stable running on surface roughness index designated by ΔCv (10%–1%). In FIG. 2, the circle marks represent a case where the non-magnetic base plate was subjected to ultrasonic processing, while triangle marks represent a case where the non-magnetic base plate was not subjected to ultrasonic processing. The surface roughness was measured in the radial direction of the magnetic recording medium by using a contact stylus having a radius of curvature of 2 μm at the foremost end thereof. As is apparent from FIG. 2, in the case where the non-magnetic base plate was not subjected to ultrasonic processing, it is necessary that the surface roughness index ΔCv (10%–1%) is enlarged so as to allow the coefficient of kinetic friction to be reduced. The contrary happens in the case where the non-magnetic base plate was subjected to ultrasonic processing, i.e. there is no dependence of the coefficient of kinetic friction on the surface roughness index ΔCv (10%–1%). The floatation height of the magnetic head during its stable running is increased more and more as the surface roughness ΔCv (10%–1%) is enlarged, regardless of a presence or an absence of ultrasonic processing for the nonmagnetic base plate. Consequently, in the case where the non-magnetic base plate is subjected to ultrasonic processing, it suffices that the surface roughness index ΔCv (10%–1%) of the base plate adequately corresponds to a required floatation height of a magnetic head during its stable running without any necessity for consideration of surface friction properties of the magnetic recording medium.

As may be apparent from FIG. 2, in the case where the base plate is subjected to ultrasonic processing, it is considered that the surface frictional properties of the magnetic recording medium does not depend on the surface roughness but this is attributable to the fact that surface roughness is evaluated by employing a contact stylus system at present. For this reason, it is considered that dependence of the coefficient of kinetic friction on the surface roughness can be recognized by employing a method, such as scanning tunneling microscopy with which the surface roughness can be observed two dimensionally and can be better evaluated.

Also in the case of a method of evaluating a surface roughness by employing the contact stylus system, dependence of a coefficient of kinetic friction on the surface roughness can be recognized by measuring the surface roughness in the direction of the sliding of a magnetic head, i.e., in the circumferential direction of the base plate. The magnetic head slides in the circumferential direction of the surface of a magnetic recording medium in a floated state. For this reason, it is important that a number of fine projections are formed in conformity with what type of pattern in the circumferential direction on the surface of the magnetic recording medium. In view of the foregoing fact, a curve representing a surface roughness of the base plate in the circumferential direction was first plotted. Then, measurements were conducted to detect how many projections each having a height equal to or greater than 0.01 μm as measured from a center line of the curve were present per unit length of 2.5 mm in the circumferential direction of the base plate so that the number of detected projections was used as a peak count Pc 2 (0.01 μm). Magnetic recording mediums were fabricated using base plates each having a diameter of 3.5 inches of which the surface was ground so as to allow the base plates to have various peak counts wherein the respective base plates were subjected to ultrasonic processing in the same manner as those belonging to the aforementioned first group. Then, leach magnetic recording medium was placed on a magnetic disc unit, and a magnetic head was located at the position opposite to the magnetic recording medium at a radius of 21.5 mm. Then, a coefficient of kinetic friction was measured with respect to each magnetic recording medium.

Figure 3:
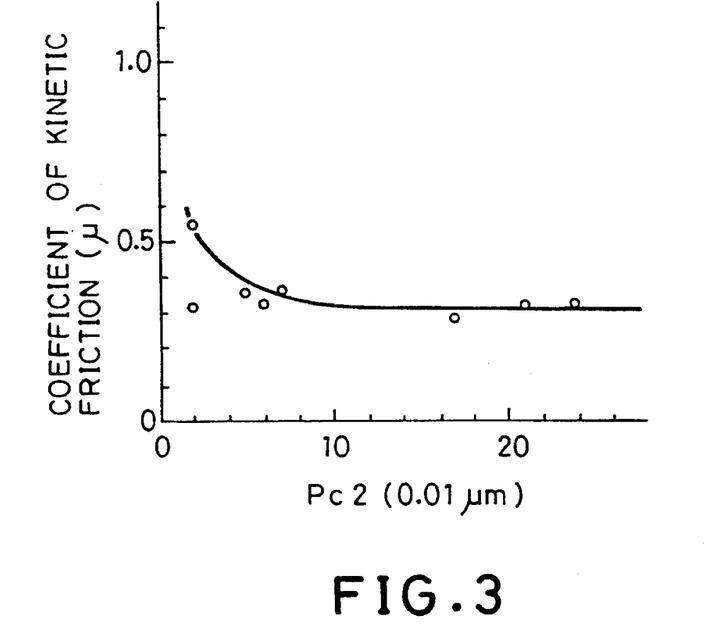
FIG. 3 is a diagram illustrating the relationship between the peak count Pc2 (0.01 μm) as measured in a circumferential direction of the base plate and the coefficient of kinetic friction of the magnetic recording medium.

FIG. 3 shows a relationship between the peak count Pc 2 (0.01 μm) and the coefficient of kinetic friction. As shown in FIG. 3, it is preferable that the peak count of each base plate in the circumferential direction of the same is controlled in order to control the coefficient of kinetic friction at a high accuracy. In addition, it is obvious from FIG. 3 that the peak count Pc 2 (0.01 μm) should be set to be not less than 5 in order to maintain the coefficient of kinetic friction to a desirable value of not more than 0.4. However, since the coefficient of kinetic friction does not vary when the peak count Pc 2 (0.01 μm) is more than 10, it suffices that its upper limit is set to 30.

Additionally, the influence of a center-line mean roughness Ra specified in accordance with ISO 468-1982 and JIS (Japanese Industrial Standard) B 0601 was examined in association with the surface roughness of each base plate. To this end, a plurality of base plates having various center-line mean roughness Ra but a single diameter of 3.5 inches were first prepared and then by using these base plate magnetic recording mediums were fabricated in the same manner as those belonging to the first group.

Figure 4:
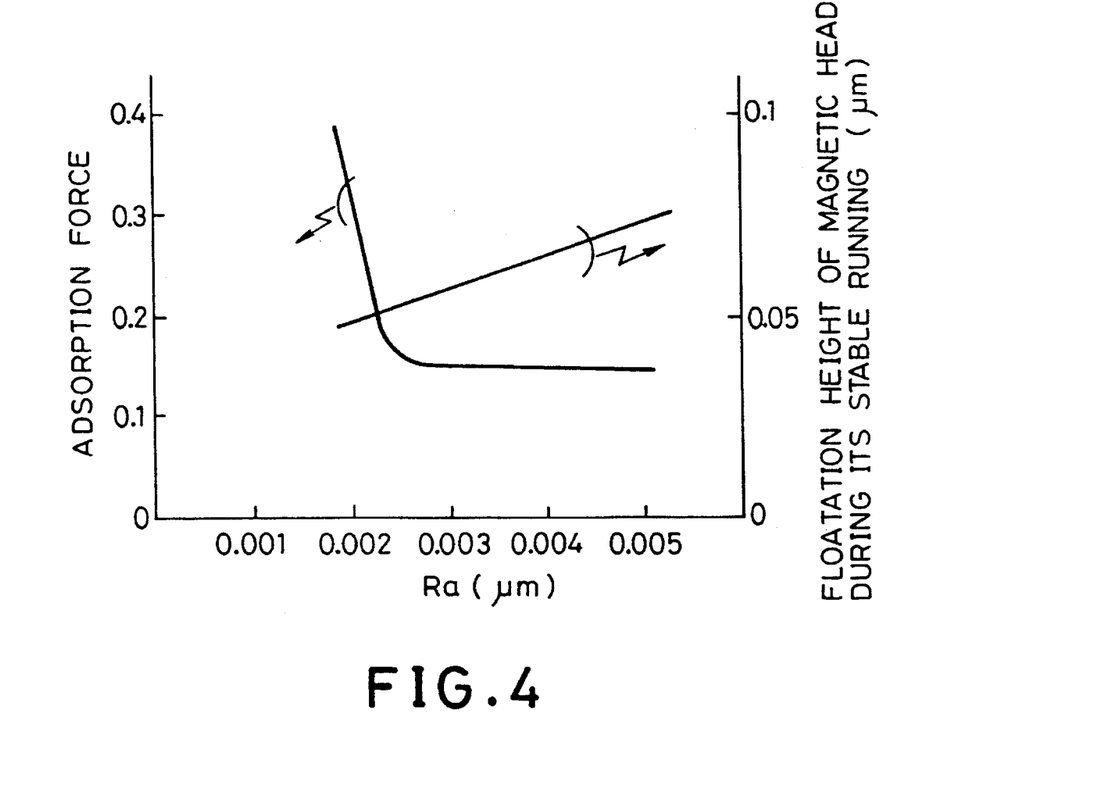
FIG. 4 is a diagram illustrating the dependency of the adsorption force between the magnetic head and the base plate and the floatation height of the magnetic head during its stable running on a center-line mean roughness Ra of the base plate.

FIG. 4 is a diagram which illustrates by way of example relationships between the center-line mean roughness Ra and the adsorption force between a magnetic head (ferrite head) and the magnetic recording medium as well as the floatation height of the magnetic head during its running. A series of measurements were conducted at the position of a radius of 21.5 mm. The center-line mean roughness Ra was measured in the radial direction of the magnetic recording medium using a contact stylus having a radius of curvature of 2 μm at the foremost end thereof. In FIG. 4, the adsorption force is represented in the form of a coefficient of friction which is measured after the magnetic recording medium was kept still for 24 hours under such an environmental circumstance as a temperature of 33° C. and a relative humidity of 80%. The larger the numerical value, the larger the adsorption force. This means that the magnetic head is easily adsorbed as the adsorption force is enlarged. As is apparent from FIG. 4, when the center-line mean roughness Ra is not more than 0.0025 μm, the adsorption force is rapidly enlarged but this is not desirable. In addition, since the floatation height of a magnetic head during its stable running is enlarged in normal proportion to the center-line mean roughness Ra, it is necessary that the center-line mean roughness Ra is maintained within an adequate range corresponding to the floatation height of the magnetic head.

Since the extent of coarsening of the surface of the magnetic recording medium as a result of the ultrasonic processing is very small, a value of the center-line mean roughness Ra on the surface of the base plate, the maximum surface roughness Rmax, the index ΔCv (10%–1%) and the peak count Pc2 (0.01 μm) appearing on the surface of the base plate formed by a grinding operation hardly vary before and after the ultrasonic processing.

An Ni—P alloy layer was formed on the surface of each of disc-shaped aluminum alloy plates each having a diameter of 3.5 inches by employing a electroless plating process and the surface of each Ni—P alloy layer was ground to assume a thickness of 12 μm, whereby a non-magnetic base plate having a center-line mean roughness Ra of 0.005 μm, a maximum surface roughness Rmax of about 0.1 μm and an index ΔCv (10%–1%) of about 0.01 μm was produced. After the base plate was washed using a surfactant or using pure water to remove abrasive materials or the like therefrom, the surface of the base plate was subjected to ultrasonic processing while the base plate was immersed in a pure water. In practice, the base plate was subjected to ultrasonic processing at a frequency of 750 kHz±100 kHz for two minutes while an oscillation output was stepwise varied by way of four steps of 26 W, 63 W, 116 W and 175 W.

Subsequently, a chromium underlayer, a cobalt alloy magnetic layer and an amorphous carbon protective lubricant layer were successively formed on the surface of the base plate by means sputtering, respectively. Then, a fluorocarbon liquid lubricant was additionally coated on the resultant layered structure thereby to fabricate a magnetic recording medium. A composition of the cobalt alloy magnetic layer and the thickness of each layer are shown in the preceding description. It should be noted that a significant difference before and after the ultrasonic processing in respect of a surface roughness on the base plate was hardly recognized, and an increase of about 0.0005 μm of the center-line mean roughness Ra, an increase of about 0.025 μm of the maximum height Rmax and an increase of about 0.002 μm of the index ΔCv (10%–1%) were recognized in association with the surface roughness of the base plate but their remarkable variation was not recognized.

A series of slide contact tests were conducted as an acceleration test for surface frictional properties of each magnetic recording medium. Each of the tests was a kind of sliding friction and wear test to be conducted while a magnetic head was brought in slidable contact with the surface of a rotating magnetic recording medium. Two kinds of magnetic heads, i.e., a thin film head having a ceramics of $Al_2O_3$/Tic used as a slider therefor (ceramics head) and an Mn—Zn ferrite head were used as a magnetic head. While the magnetic head slidably moves, a vertical load of 6 gf in a case of the ceramic head was exerted on the magnetic head and a vertical load of 10 gf in a case of the ferrite head was exerted on the magnetic head. The magnetic recording medium was rotated at 100 rpm. In addition, the position where the magnetic head came in slidable contact with the magnetic recording medium was set to a position at a radius of 21.5 mm in the magnetic recording medium regardless of the kind of the magnetic heads.

Figure 5:
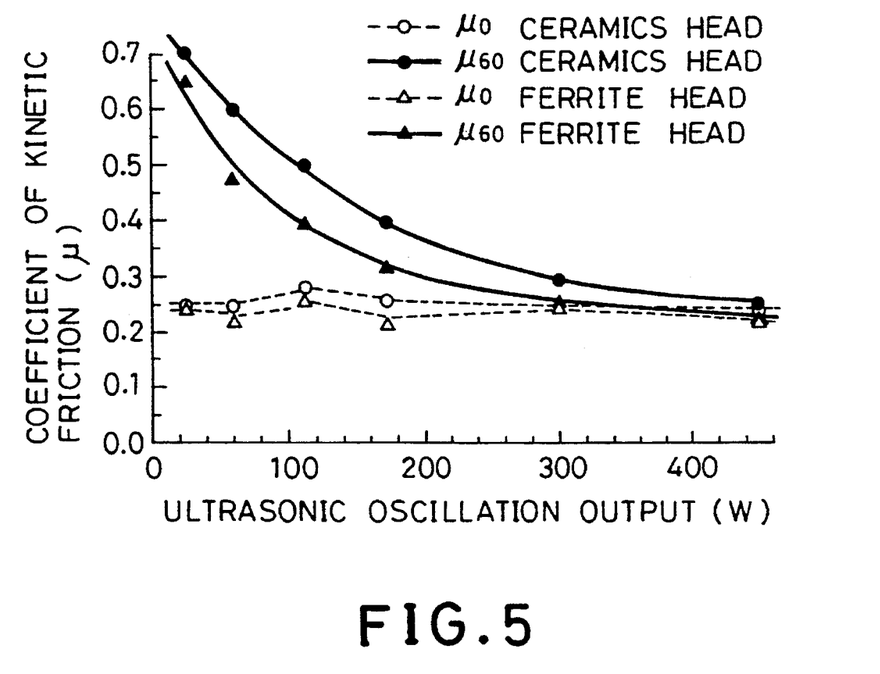
FIG. 5 is a diagram illustrating the relationship between the coefficient of kinetic friction during a slide contact test and the ultrasonic oscillation output during ultrasonic processing.
Figure 6:
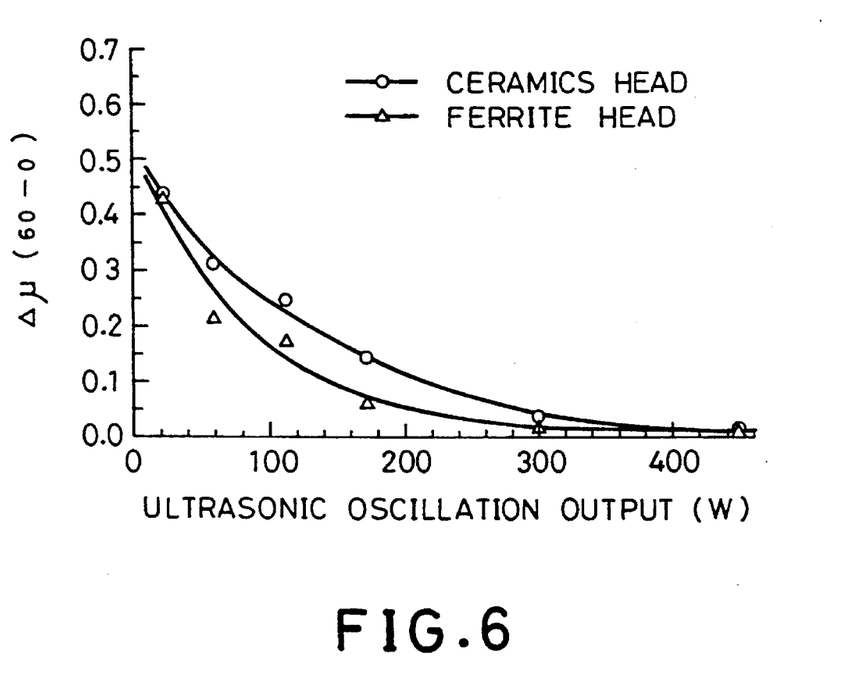
FIG. 6 is the diagram illustrating a relationship between a fluctuation $\Delta\mu_{(60-0)}$ of the coefficient of kinetic friction during a slide contact test and the ultrasonic oscillation output while practically employed magnetic heads are used as a parameter.

FIG. 5 is a diagram which illustrates the relationship between the ultrasonic oscillation output and coefficients of kinetic friction $\mu$ measured during the aforementioned tests. In FIG. 5 the initial coefficient of kinetic friction $\mu_0$ and a coefficient of kinetic friction $\mu_{60}$ appearing after sixty minutes elapsed from start of slidable movement of the magnetic head are shown with respect to magnetic heads employed for the tests. FIG. 6 is a diagram which illustrates a relationship between the difference $\Delta\mu_{(60-0)}$ between $\mu_{60}$ and $\mu_0$ and the ultrasonic oscillation output under a condition that the magnetic heads employed for the tests were used as a parameter.

As is apparent from FIG. 5, provided that a ultrasonic processing time is set to a constant (in the shown case, it is kept constant for two minutes), the initial coefficient of friction $\mu_0$ hardly varies no matter how the ultrasonic oscillation output varies. However, after sixty minutes elapses from the start of the slidable movement, the coefficient of friction $\mu_{60}$ varies such that it is remarkably reduced as the ultrasonic oscillation output increases. Therefore, as is apparent from FIG. 6, the difference $\Delta\mu_{(60-0)}$ between $\mu_{60}$ and $\mu_0$ is remarkably reduced as the ultrasonic oscillation output increases. It should be noted that a slight different is recognized in respect of the aforementioned tendency depending on the kinds of the magnetic head employed for the tests, and moreover, it is obvious that no significant difference is present between two magnetic heads although the ferrite head has a smaller difference of $\Delta\mu_{(60-0)}$ than the ceramic head. In addition, it is obvious from the aforementioned facts that required surface frictional properties having small variation of the coefficient of kinetic friction are obtainable by properly adjusting the ultrasonic oscillation output.

To meet the requirement for surface frictional properties of a magnetic recording medium available at a next generation, it is required at present that $\mu_{60}$ is equal to or less than 0.4 and $\Delta\mu_{(60-0)}$ is equal to or less than 0.2. According to the embodiments of the present invention shown in the drawings, it is apparent that the aforementioned requirement can satisfactorily be met when the ultrasonic oscillation output is set to be equal to or more than 110 W in a case of the ferrite head and it is set to be equal to or more than 175 W in a case of the ceramics head. In addition, it has been confirmed that it is effectively employable to vary an ultrasonic processing time instead of variation of the ultrasonic oscillation output. There is a tendency that as the ultrasonic oscillation output is enlarged and the ultrasonic processing time is elongated, a surface roughness of the base plate increases slightly but it varies little. Additionally, it has been found that as a surface state of the base plate varies, surface frictional properties of the magnetic recording medium vary accordingly.

Further, it has been found that as long as a ultrasonic frequency remains within the range of 200 kHz to 1600 kHz, the surface state of the base plate can be varied without substantial variation of the surface roughness of the base plate.

Next, the floatation height of the magnetic head during its stable running was examined with respect to the respective magnetic recording mediums. As a result, stable floating of the magnetic head could practically be realized with a floatation height of not more than 0.08 $\mu$m.

It was confirmed that a floatation height of the magnetic head was determined depending on a surface roughness of the non-magnetic base plate employed for the magnetic recording medium. In detail, with respect to the base plate having such a surface roughness that the center-line mean roughness Ra remained within a range from 0.002 $\mu$m to 0.006 $\mu$m, the maximum height Rmax was equal to or less than 0.05 $\mu$m and the index $\Delta$Cv (10%–1%) remained within a range from 0.002 $\mu$m to 0.009 $\mu$m, a floatation height of 0.1 $\mu$m of the magnetic head during its stable running could be obtained. In addition, with respect to the base plate having such a surface roughness that the center-line mean roughness Ra remains within a range from 0.0005 $\mu$m to 0.0025 $\mu$m, the maximum height Rmax was equal to or less than 0.02 $\mu$m and the index $\Delta$Cv (10%–1%) was equal to or less than 0.005 $\mu$m, a very small height of 0.05 $\mu$m of floatation of the magnetic head during its stable running could be obtained. Additionally, with respect to the base plate having such a surface roughness that the center-line mean roughness Ra as measured using a contact stylus having a radius of curvature of 2 $\mu$m at the foremost end thereof remains within a range from 0.0025 $\mu$m to 0.0045 $\mu$m, the index $\Delta$Cv (10%–1%) remained within a range from 0.006 $\mu$m to 0.01 $\mu$m and the peak count Pc2 (0.01 $\mu$m) measured using a contact stylus similar to the foregoing one remains within a range from 5 to 30, a height of 0.08 $\mu$m of floatation of the magnetic head during its stable running, which is balanced against the adsorption force, could be assured.

According to the aforementioned embodiments of the present invention, a pure water was used as a liquid employable at the time of ultrasonic processing but the present invention should not be limited only to this. Alternatively, a neutral detergent solution usable for cleaning a base plate, an alkaline detergent solution, isopropyl alcohol, or an inorganic detergent solution may be used. In addition, cleaning and ultrasonic processing may simultaneously be effected for the base plate. Further, the non-magnetic base plate should not be limited only to such a base plate that an Ni—P alloy layer is formed on an aluminum alloy plate. It is effectively acceptable that a base plate composed of an aluminum alloy plate of which surface is subjected to alumilite processing, a base plate composed of an amorphous carbon having a high density or the like is used for non-magnetic base plate.

The present invention can be applied to fabricate a magnetic recording medium having magnetic recording layer on both surfaces of the base plate as well as the medium having a magnetic recording layer on one surface of the base plate.

The surface of a non-magnetic base plate which is subjected to ultrasonic processing while it is immersed in a liquid has not been hitherto visually observed at a high accuracy. However, it is considered that when the base plate is subjected to ultrasonic processing, it exhibits a surface state in which its coarse surface is much more finely coarsened while substantially maintaining the surface roughness obtained by performing a grinding operation. A magnetic recording medium fabricated by using the base plate having the foregoing surface state exhibits a small coefficient of friction and adequate surface frictional properties. Therefore, in contrast with the conventional magnetic recording medium, the magnetic recording medium fabricated in accordance with the present invention does not require that a number of special fine projections are formed on the surface thereof. For this reason, the base plate can be subjected to a surface griding operation without any particular consideration on surface frictional properties of the magnetic recording medium, and moreover, it is possible to reduce a floatation height of a magnetic head during its stable running by reducing a surface roughness of the base plate without necessity for forming a number of fine projections on the surface of the base plate. In this manner, the present invention can provide a magnetic recording medium which has adequate surface frictional properties, and moreover, makes it possible to practically realize stable running of a magnetic head in a very low floated state.

According to the present invention, it is effectively acceptable that the base plate is subjected to ultrasonic processing in a liquid other than a water, and moreover, it is possible to practice a step of ultrasonic processing as part of a step of precisely cleaning the base plate so as to obtain an intense cleaning effect at the same time when the cleaning operation is performed. In addition, since the surface state of the base plate can be varied without substantial variation of a surface roughness of the base plate, this makes it possible to control surface fictional properties of the base plate without variation of a floatation height of the magnetic head during its stable running.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A magnetic recording medium comprising:

a non-magnetic disc-shaped base plate;

a magnetic layer, and a protective layer successively formed on said non-magnetic base plate, wherein an upper surface of said non-magnetic base plate is provided with a texture in a circumferential direction, and a surface roughness of said base plate is such that a center-line mean roughness Ra as measured in the radial direction of the base plate is within the range from 0.0025 µm to 0.0045 µm, an index ΔCv derived from subtraction of a cutting depth corresponding to one percent bearing length ratio on a curve of a profile bearing length ratio from a cutting depth corresponding to ten percent bearing length ratio on said curve is within a range from 0.006 µm to 0.01 µm, and a count number Pc2 equal to the number of projections having a height measured from the center of a surface roughness curve extending in the circumferential direction of the base plate of not less than 0.01 µm, is within a range from 5 to 30 per unit length of 2.5 mm in the circumferential direction of the base plate.

2. A magnetic recording medium as claimed in claim 1, wherein said non-magnetic base plate is composed of an Al alloy plate and an Ni—P layer is formed on said Al alloy plate.

3. A magnetic recording medium as claimed in claim 1, wherein said protective layer is a carbon layer.

4. A magnetic recording medium as claimed in claim 1, wherein said medium further comprises a liquid lubricant layer applied on said protective layer.

5. A magnetic recording medium as claimed in claim 1, wherein said magnetic layer is made of a Co alloy and a Cr underlayer is formed between said non-magnetic base plate and said magnetic layer.

6. A magnetic recording medium comprising:

a non-magnetic disc-shaped base plate;

a magnetic layer; and a protective layer successively formed on said non-magnetic base plate, wherein an upper surface of said non-magnetic base plate is provided with a texture in a circumferential direction, and a surface roughness of said base plate is such that a center-line mean roughness Ra as measured in the radial direction of the base plate is within the range from 0.002 µm to 0.006 µm, a maximum roughness Rmax is not larger than 0.05 µm, and an index ΔCv derived from subtraction of a cutting depth corresponding to one percent bearing length ratio on a curve of a profile bearing length ratio from a cutting depth corresponding to ten percent bearing length ratio on said curve is within a range from 0.002 µm to 0.009 µm.

7. A magnetic recording medium as claimed in claim 6, wherein said magnetic layer is made of a Co alloy and a Cr underlayer is formed between said non-magnetic base plate and said magnetic layer.

8. A magnetic recording medium as claimed in claim 7, wherein said non-magnetic base plate is composed of an Al alloy plate and an Ni—P layer is formed on said Al alloy plate.

9. A magnetic recording medium as claimed in claim 8, wherein said protective layer is made of carbon.

10. A magnetic recording medium as claimed in claim 9, wherein a liquid lubricant layer is formed on said protective layer.

11. A magnetic recording medium comprising:

a non-magnetic disc-shaped base plate;

a magnetic layer and a protective layer successively formed on said non-magnetic base plate;

wherein an upper surface of said non-magnetic base plate is provided with a texture in a circumferential direction, and a surface roughness of said base plate is such that a center-line mean roughness Ra as measured in the radial direction of the base plate is within the range from 0.0005 µm to 0.0025 µm, a maximum roughness Rmax is not larger than 0.02 µm, and an index ΔCv derived from subtraction of a cutting depth corresponding to one percent bearing length ratio on a curve of a profile bearing length ratio from a cutting depth corresponding to ten percent bearing length ratio on said curve is not larger than 0.005 µm.

12. A magnetic recording medium as claimed in claim 11, wherein said magnetic layer is made of a Co alloy and a Cr underlayer is formed between said non-magnetic base plate and said magnetic layer.

13. A magnetic recording medium as claimed in claim 12, wherein said non-magnetic base plate is composed of an Al alloy plate and an Ni—P layer is formed on said Al alloy plate.

14. A magnetic recording medium as claimed in claim 15, wherein said protective layer is made of carbon.

15. A magnetic recording medium as claimed in claim 14, wherein a liquid lubricant layer is formed on said protective layer.

* * * * *